United States Patent
DeMao et al.

(10) Patent No.: US 9,839,104 B2
(45) Date of Patent: Dec. 5, 2017

(54) SYSTEMS AND METHODS OF PROVIDING ENHANCED ELECTRIC FENCE DIAGONSTICS

(71) Applicant: Electric Guard Dog, LLC, Columbia, SC (US)

(72) Inventors: Jack DeMao, Charlotte, NC (US); Steve Batti, Banks, OR (US); Michael Baxter, Portland, OR (US); Mark Roberts, Beaverton, OR (US)

(73) Assignee: ELECTRIC GUARD DOG, LLC, Columbia, SC (US)

( * ) Notice: Subject to any disclaimer, the term of this patent is extended or adjusted under 35 U.S.C. 154(b) by 269 days.

(21) Appl. No.: 14/775,216

(22) PCT Filed: Mar. 14, 2014

(86) PCT No.: PCT/US2014/028284
§ 371 (c)(1),
(2) Date: Sep. 11, 2015

(87) PCT Pub. No.: WO2014/144041
PCT Pub. Date: Sep. 18, 2014

(65) Prior Publication Data
US 2016/0029466 A1 Jan. 28, 2016

Related U.S. Application Data

(60) Provisional application No. 61/787,425, filed on Mar. 15, 2013.

(51) Int. Cl.
*H02J 1/00* (2006.01)
*H05C 1/04* (2006.01)
(Continued)

(52) U.S. Cl.
CPC ............. *H05C 1/04* (2013.01); *G01R 21/133* (2013.01); *G01R 31/02* (2013.01); *G01R 31/3606* (2013.01); *H05C 1/06* (2013.01)

(58) Field of Classification Search
None
See application file for complete search history.

(56) References Cited

U.S. PATENT DOCUMENTS

| 4,037,269 A | 7/1977 | Ferguson |
| 4,114,185 A | 9/1978 | Gallagher |

(Continued)

FOREIGN PATENT DOCUMENTS

| AU | 735681 B3 | 7/2001 |
| AU | 2003100627 A4 | 9/2003 |

(Continued)

OTHER PUBLICATIONS

International Search Report and Written Opinion for PCT/US2014/028284 dated Aug. 21, 2014.

(Continued)

*Primary Examiner* — Jared Fureman
*Assistant Examiner* — Aqeel Bukhari
(74) *Attorney, Agent, or Firm* — Brown & Michaels, PC

(57) ABSTRACT

An electric fence control unit includes a signal generator, a first signal receiver, a second signal receiver, a signal processing and control unit, and a communications interface. The signal generator generates and transmits an adjustable power signal along a conduction path of the electric fence. The signal receivers sample signal outputs at a driven end and at an open end of the fence line. The signal processing and control unit receives and analyzes the first signal output and the second signal output. The communications interface transmits results from processing the first signal output and the second signal output to a service center. The power (Continued)

signal is adjustable to any capacity power level between a maximum power level and a minimum power level to match a load of the electric fence. Methods of monitoring the electric fence, including adjusting a power level of the adjustable power signal, are also disclosed.

25 Claims, 9 Drawing Sheets

(51) Int. Cl.
  *H05C 1/06* (2006.01)
  *G01R 21/133* (2006.01)
  *G01R 31/02* (2006.01)
  *G01R 31/36* (2006.01)

(56) References Cited

U.S. PATENT DOCUMENTS

| | | | |
|---|---|---|---|
| 4,200,809 | A | 4/1980 | Madsen |
| 4,270,735 | A | 6/1981 | Gavin |
| 4,297,633 | A | 10/1981 | McCutchan et al. |
| 4,310,869 | A | 1/1982 | Niven |
| 4,316,232 | A | 2/1982 | Phillips et al. |
| 4,394,583 | A | 7/1983 | Standing |
| 4,396,879 | A | 8/1983 | Weinreich et al. |
| 4,691,084 | A | 9/1987 | Standing |
| 4,859,868 | A | 8/1989 | McKissack |
| 4,939,618 | A | 7/1990 | Fingerson et al. |
| 5,285,195 | A | 2/1994 | Way et al. |
| 5,381,298 | A | 1/1995 | Shaw et al. |
| 5,460,123 | A | 10/1995 | Kolz |
| 5,514,919 | A | 5/1996 | Walley |
| 5,550,530 | A | 8/1996 | Hamm |
| 5,596,281 | A | 1/1997 | Eriksson |
| 5,742,104 | A | 4/1998 | Eriksson et al. |
| 5,742,469 | A | 4/1998 | Hamm |
| 5,767,592 | A | 6/1998 | Boys et al. |
| 5,771,147 | A | 6/1998 | Eriksson et al. |
| 5,790,023 | A | 8/1998 | Wolfgram et al. |
| 5,877,949 | A | 3/1999 | Wolfgram et al. |
| 5,973,413 | A | 10/1999 | Walley |
| D419,957 | S | 2/2000 | Burdick |
| 6,020,658 | A | 2/2000 | Woodhead et al. |
| 6,065,427 | A | 5/2000 | Peinetti |
| 6,116,192 | A | 9/2000 | Hultine et al. |
| 6,398,191 | B1 | 6/2002 | Forsberg |
| 6,479,909 | B1 | 11/2002 | Hamm et al. |
| 6,690,565 | B2 | 2/2004 | Montreuil |
| 6,801,045 | B2 | 10/2004 | Hamm et al. |
| 7,148,779 | B2 | 12/2006 | Wolfgram |
| 7,268,562 | B2 | 9/2007 | Aisenbrey |
| 7,582,988 | B2 | 9/2009 | Wolfgram |
| 7,835,131 | B2 | 11/2010 | Hurly |
| 7,893,521 | B2 | 2/2011 | Lunenburg et al. |
| 7,944,669 | B2 | 5/2011 | Wolfgram |
| 8,120,212 | B2 | 2/2012 | Hamm et al. |
| 8,120,213 | B2 | 2/2012 | Hurly |
| 8,415,962 | B2 | 4/2013 | Shan et al. |
| 2001/0011950 | A1* | 8/2001 | Carson .......... A01K 3/005 340/635 |
| 2002/0079909 | A1 | 6/2002 | Reeves |
| 2004/0169171 | A1 | 9/2004 | Reeves et al. |
| 2006/0126260 | A1 | 6/2006 | Fehse |
| 2008/0186172 | A1 | 8/2008 | Thompson |
| 2009/0109026 | A1 | 4/2009 | Thompson |
| 2010/0139576 | A1 | 6/2010 | Kim et al. |
| 2011/0211292 | A1 | 9/2011 | Tyler |
| 2012/0133378 | A1* | 5/2012 | Shan .......... G08B 13/08 324/713 |

FOREIGN PATENT DOCUMENTS

| | | |
|---|---|---|
| AU | 2003252846 A1 | 4/2004 |
| AU | 2004201668 A1 | 12/2004 |
| AU | 2005100855 A4 | 12/2005 |
| AU | 2005100856 A4 | 12/2005 |
| AU | 2010100764 A4 | 9/2010 |
| AU | 2011204810 A1 | 2/2012 |
| AU | 2012202699 A1 | 11/2012 |
| FR | 2673020 A1 | 8/1992 |
| JP | 2006163659 A | 6/2006 |
| KR | 1020120068065 A | 6/2012 |
| NZ | 240641 A | 7/1995 |
| NZ | 530924 A | 6/2005 |
| WO | 9617440 A1 | 6/1996 |
| WO | 0035253 A1 | 6/2000 |
| WO | 2004095893 A1 | 11/2004 |
| WO | 2008083434 A1 | 7/2008 |
| WO | 2010062200 A1 | 6/2010 |

OTHER PUBLICATIONS

Extended European International Search Report from PCT/US2014/0428284 dated Jan. 20, 2016.

* cited by examiner

SYSTEMS AND METHODS OF PROVIDING ENHANCED ELECTRIC FENCE DIAGONSTICS

REFERENCE TO RELATED APPLICATIONS

This application claims one or more inventions which were disclosed in Provisional Application No. 61/787,425, filed Mar. 15, 2013, entitled "SYSTEMS AND METHODS OF PROVIDING ENHANCED ELECTRIC FENCE DIAGNOSTICS". The benefit under 35 USC §119(e) of the United States provisional application is hereby claimed, and the aforementioned application is hereby incorporated herein by reference.

BACKGROUND OF THE INVENTION

Field of the Invention

The invention pertains to the field of electrical fences. More particularly, the invention pertains to systems and methods of enhanced electrical fence diagnostics.

Description of Related Art

Electric fence energizers provide an electrical pulse down a fence wire that is intended to deter intruders. This pulse is designed to be non-lethal but of sufficient magnitude to be an effective deterrent. Unfortunately, current conventional energizers have several drawbacks. These drawbacks include that they provide no guidance to locate a fault in the fence on a very large premise, they provide very little feedback, if any, about the condition of a fence or energizer prior to a catastrophic failure, and they provide a limited range of power output levels.

SUMMARY OF THE INVENTION

An electric fence system includes a first electric fence having a first fence line and an electric fence control unit. The electric fence control unit includes a signal generator, a first signal receiver, a second signal receiver, a signal processing and control unit, and a communications interface. The signal generator generates and transmits an adjustable power signal along a conduction path of the electric fence. The signal receivers sample signal outputs at a driven end and at an open end of the fence line. The signal processing and control unit receives and analyzes the first signal output and the second signal output. The communications interface transmits results from processing the first signal output and the second signal output to a service center, including automated reporting of faults and other events. The power signal is adjustable to any capacity power level between a maximum power level and a minimum power level to match a load of the electric fence.

Methods of monitoring the electric fence, including adjusting a power level of the adjustable power signal, are also disclosed.

DETAILED DESCRIPTION OF THE INVENTION

Figure 1:
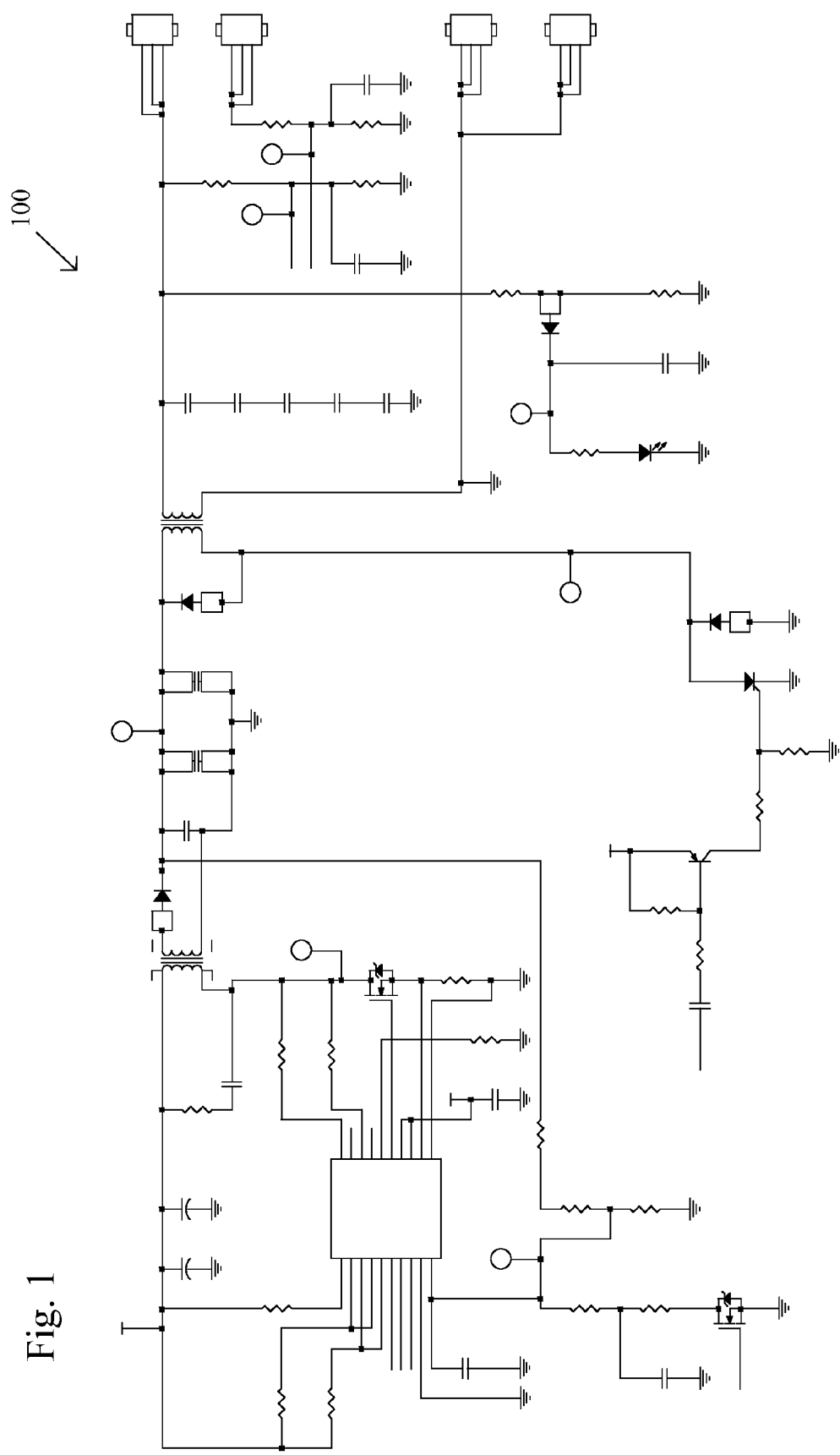
FIG. 1 shows a circuit diagram of an energizer for an electric fence system in an embodiment of the present invention.

An electric fence may be used for security or animal control. An electric fence system preferably includes an electric fence, an energizer electrically coupled to the electric fence, forming a conduction route along the electric fence, and providing a continuously-variable power output of electricity to the electric fence, and a microprocessor operatively coupled to the energizer to produce the first continuously-variable power output, operatively coupled to sample the continuously-variable power output and a reflected return signal over time, and operatively coupled to sample a transmitted return signal over time. The microprocessor may be separate from the energizer or incorporated into the energizer.

An adjustable electric signal generator produces an initial signal. The system couples this signal to a single-wire transmission line. The signal propagates down the single-wire transmission line towards the opposite end. In a preferred embodiment, a receiver monitors the transmission line at each end and forwards the signals received to a signal processing and control unit. The signal processing and control unit stores measurements of the signals for analysis. The signal processing and control unit receives further signals from the system input power, which may be supplied by a mains power input, a battery, or an auxiliary power input, such as a solar power panel or a wind generator. This signal processing and control unit preferably includes a microprocessor with associated random-access memory and program memory. The signal processing and control unit also communicates with a service center, either through a direct local connection, through a telephone line, via a connection to the internet, or by means of a radio link, such as a cellular telephone modem. In one preferred implementation, the communication link operates bi-directionally, allowing interaction with the service center, adjustment of parameters, and the like; in another, the link operates in only one direction, allowing for a wider variety of communication links.

Embodiments of the present invention preferably address shortcomings of the prior art by providing an estimate of the location of a fault in distance from the energizer and by providing timely and appropriate condition information via analytical methods. This analytic information may be relayed via a cell phone link or a fixed connection to an operator, which is in turn used to determine the condition of the fence and energizer. Finally, in some embodiments, a method provides a continuously-variable power output to augment a location estimation system and also provides the appropriate power for a fence of any length and power requirements. This continuously-variable output has many intrinsic benefits aside from assisting with the diagnosis of faults and conditions.

Disturbances in the transmission line, caused by interruptions, plant growth, moisture, extraneous connections, or degradation of insulated wire stand-offs or other insulation, affect the timing and magnitude of the signals received at the two ends of the transmission line. Any alteration in the length of the fence also affects the timing relationship between the transmitted signal and those detected by the receivers. In one preferred embodiment, the signal processing and control unit performs comparisons of new measurements to stored values, looking for changes and for trends in measurements, possibly including consideration of information such as environmental information about weather, rainfall, and dewfall. In another preferred embodiment, the computing equipment at the service center performs the comparisons. In either case, the analysis of the stored and new measurements may indicate changes in the operation and/or integrity of the fence system. A control system at either location may automatically adjust the signal generator to ensure correct operation, report the detection of changes that indicate the need for a service call, and report conditions indicative of a security breach. The automatic adjustments allow the system to reduce power consumption to a minimum or near-minimum needed for correct operation based on environment, fence length, and current conditions, thereby extending battery life and enhancing system security by improving operational reliability of the system. The variety of reports helps reduce system operating expenses by causing security alerts only in response to likely intrusion attempts and by allowing for the scheduling of maintenance service at convenient intervals instead of in response to system failures.

In a preferred embodiment, each signal processing and control unit connects to multiple sets of adjustable signal generators and receivers. This reduces the cost of the control, signal processing, and communication means, by sharing them amongst multiple fence sections. Monitoring the fence voltage provides an additional beneficial function: It allows multiple fence control units to operate in synchrony with each other. To achieve this synchronization, couplers provide a signal path between one fence section controlled by one fence control unit and a second fence section, controlled by a second fence control unit. These couplers pass a small fraction of the signal from one fence section to another. The receivers connected to each section detect these signal fractions, and the fence control units use the signal fractions to coordinate operation in a master/slave manner, where the slave units impose their signals onto their fence sections in close time proximity to the master imposing its signals onto its fence sections. This close synchronization facilitates avoiding hazardous conditions and meeting the requirements of international standards, without the cost of separate synchronization hardware. In a preferred embodiment, the microprocessor in the signal processing and control unit adjusts both the timing and magnitude of signals generated by the adjustable signal generator. By monitoring the receiver inputs, the fence control unit detects signals coupled from other fence control units operating as masters onto any fence section it controls. If it detects another master, the signal processing and control unit may autonomously begin operation as a slave. If it fails to detect another master, or if it detects a failure of the master it follows, the unit may autonomously instigate operation as a master. Note that this system allows for arbitrarily large collections of controllers; a unit may operate as a slave monitoring a signal from another master, while at the same time acting as a master to other units. Also note that a fence control unit operating as a slave may report an alarm condition if it detects the loss of a synchronization signal it expects from a master, as that could indicate failure of the master, a break in a fence section, or other failure to maintain security.

In some embodiments, the receivers, signal processing, control, and communication functions are incorporated into a unit designed as an add-on to existing deployed systems that already incorporate the signal generators, couplers, and other functions of a conventional electric fence installation.

Figure 5:
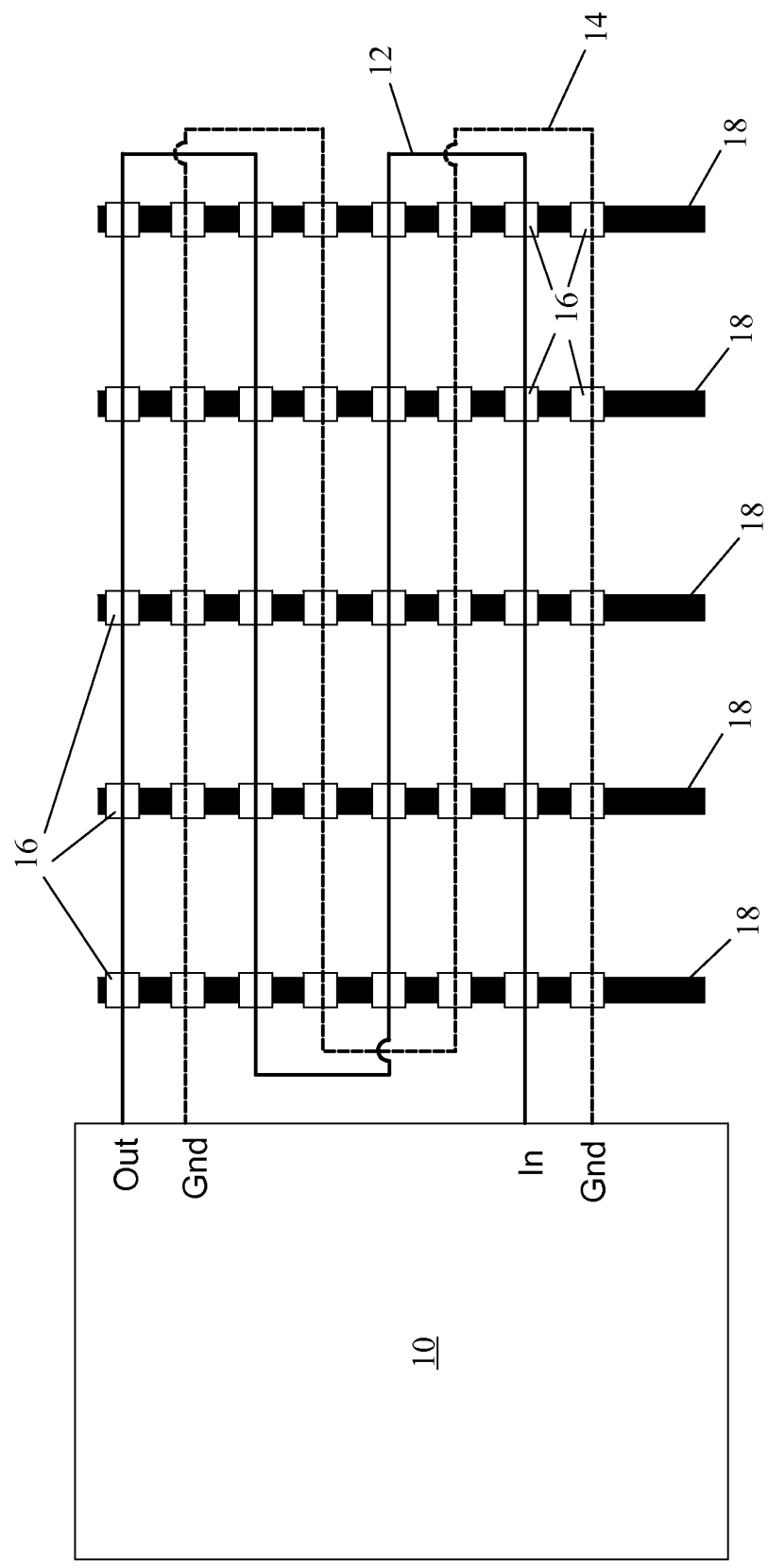
FIG. 5 shows an electric fence control unit connected to a section of electric fence.

Referring first to FIG. 5, an electric fence system includes an electric fence control unit (10) connected to a fence line (12) and a ground line (14). In a preferred embodiment, the control unit (10) connects to both ends of the fence line (12), which runs back and forth along the length of the fence in a zigzag manner, mounted with insulating stand-offs (16) to fence posts (18). The electric fence control unit (10) also connects to both ends of a second ground wire (14), which also runs in a zigzag manner the length of the fence. Note that the fence line (12) and ground line (14) occupy alternate positions along each fence post (18). This arrangement of wires helps ensure that any intruder makes a solid connection to both the hot fence line (12) and the system ground and avoids reliance on conduction to or through the actual earth. While electrical considerations do not require the use of insulating stand-offs (16) for support of the ground wire, their use makes installation consistent and also removes any visual clues as to which wires carry high voltages and which remain safe.

Figure 2:
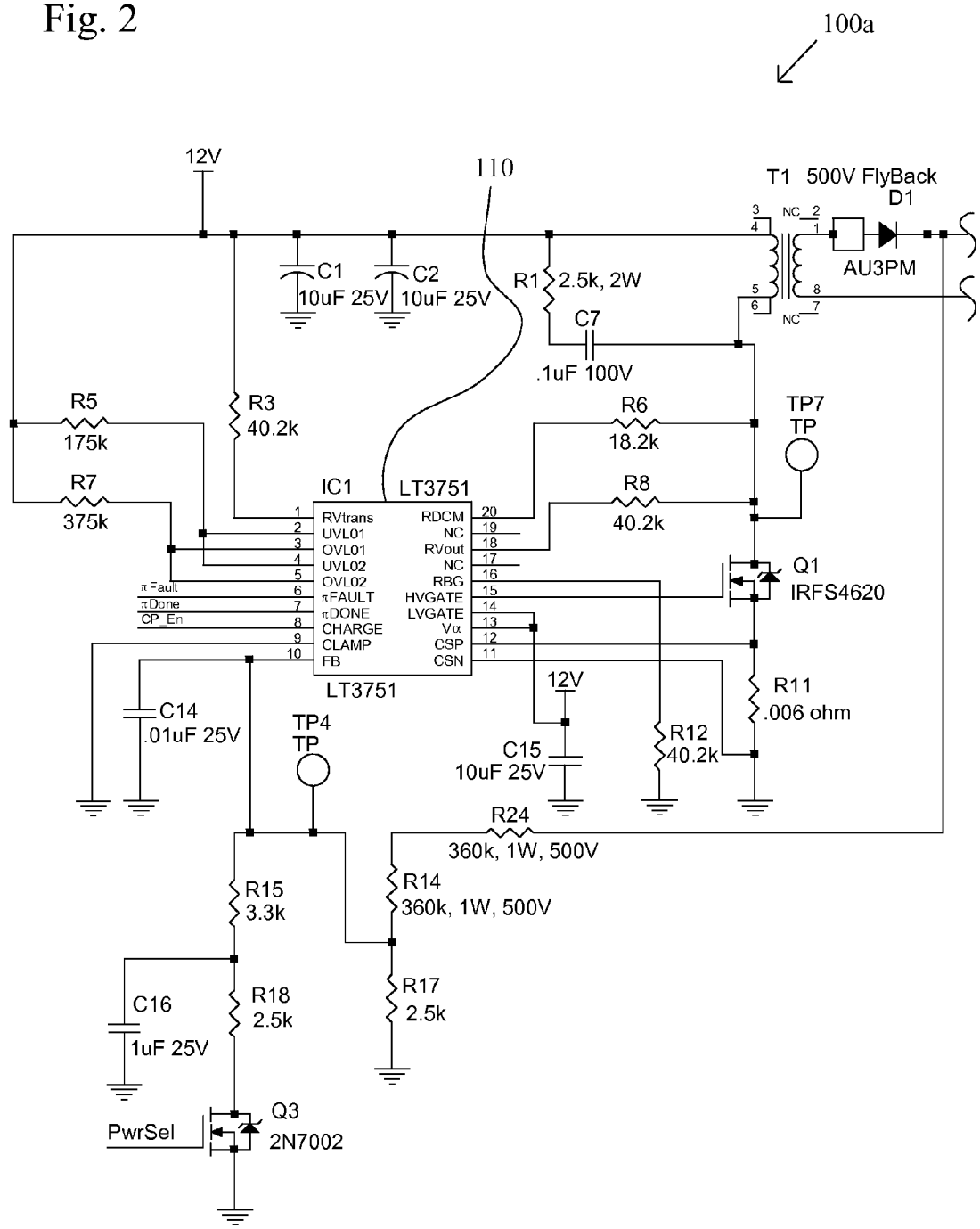
FIG. 2 shows the left portion of the circuit diagram of FIG. 1 in greater detail.
Figure 3:
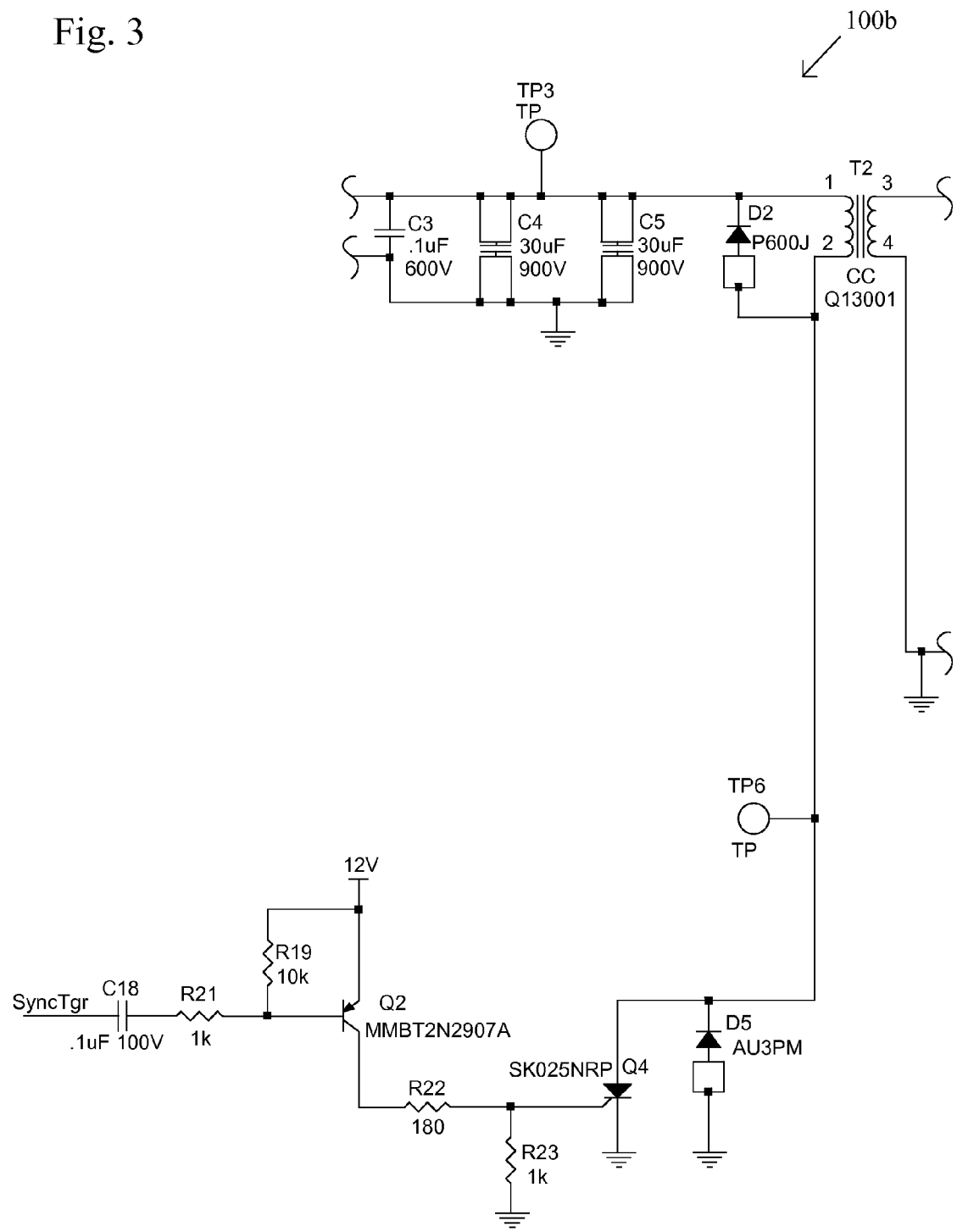
FIG. 3 shows the center portion of the circuit diagram of FIG. 1 in greater detail.
Figure 4:
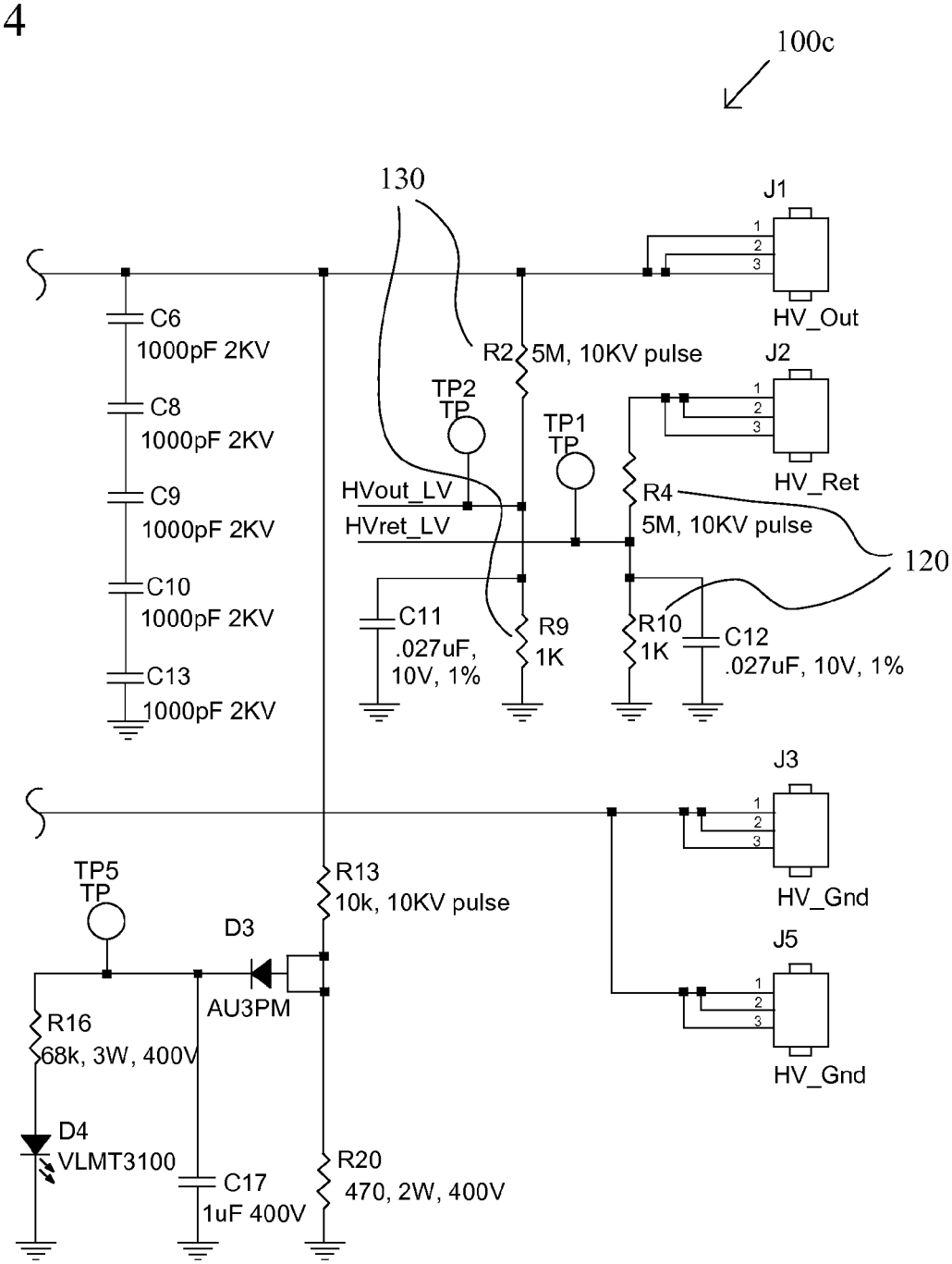
FIG. 4 shows the right portion of the circuit diagram of FIG. 1 in greater detail.

More details of preferred embodiments of the control unit (10) in FIG. 5 are shown in FIG. 1, FIG. 2, FIG. 3, FIG. 4, and FIG. 6. FIG. 1 shows a circuit diagram (100) that implements the continuously-variable power output and measurements needed for the analytic condition information in a preferred embodiment of the present invention. A closer view of the left portion (100*a*) of the circuit diagram of FIG. 1 is shown in FIG. 2. A closer view of the center portion (100*b*) of the circuit diagram of FIG. 1 is shown in FIG. 3. A closer view of the left portion (100*c*) of the circuit diagram of FIG. 1 is shown in FIG. 4. The circuit concept for the variable power is to vary the intermediate voltage of the pulse capacitors. The cap voltage is varied by biasing the feedback resistor network of the high voltage capacitor charger controller with regulation to provide any value desired. In a preferred embodiment and referring to FIG. 2, the high voltage capacitor charger controller with regulation (110) is of the type LT3751 (Linear Technology Corp., Milpitas, Calif., USA). This biasing is achieved by low-pass filtering of a pulse-width-modulated (PWM) output from a microprocessor to set the effective voltage divider value for the feedback network. Referring to FIG. 4, the circuit concept for the analytic measurements is to divide the output and return voltages, via resistor dividers r4 r10 (120) and r2 r9 (130), down to safe levels that can be directly sampled by a microprocessor. The fence is connected in a loop, where the output goes on one end of the loop and the return is the other end of the loop.

Figure 6:
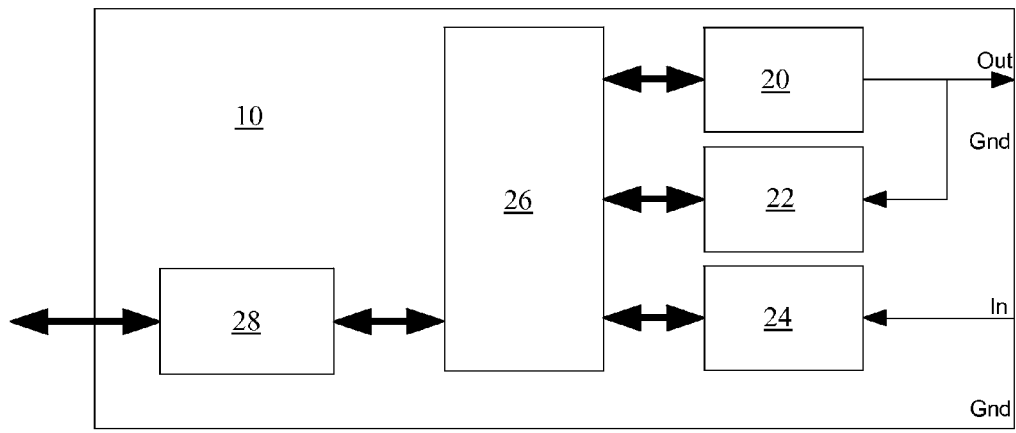
FIG. 6 shows some of the internal features of the electric fence control unit.

FIG. 6 shows internal modules, including an adjustable signal generator (20), signal receivers (22), (24), a signal processing and control unit (26), and a communications interface (28). One preferred embodiment of the adjustable signal generator is shown in FIG. 1, and in more detail collectively in FIG. 2, FIG. 3, and FIG. 4. This preferred embodiment produces high-voltage pulses based on charging intermediate capacitors C3, C4, and C5 and discharging them through the primary winding of a transformer T2 (via pins 1 and 2) and silicon control rectifier Q4. In this preferred embodiment, the signal processing and control unit (26) may adjust the voltage on the intermediate capacitors C3, C4, and C5 by pulse-width modulating the PwrSet signal connected to the gate of a transistor Q3, and initiate the firing of Q4 with the SyncTgr signal connected to C18. Other designs may be used to achieve a similar function, and other systems may generate not only high-voltage pulses as provided by the design in FIG. 1, FIG. 2, FIG. 3, and FIG. 4, but also other waveforms as desired, including those of low speed and low frequency or high speed and high frequency.

In normal operation, the signal processing and control unit (26) causes the adjustable signal generator (20) to produce periodic high voltage pulses, in conformance with standard practice and international standards. The receivers (22), (24), incorporating voltage dividers R2 R9 C11 and R4 R10 C12 and further signal amplification and analog-to-digital converters, provide measurements of the signals at both the driven end of the fence line (12) via R2 R9 and C11 (signal HVout_LV) and of the open end of the fence line via R4 R10 and C12 (signal HVret_LV). Under the direction of the signal processing and control unit (26), the analog-to-digital converters take measurements of the voltage at appropriate times and with the appropriate resolution needed for further analysis. The signal processing and control unit preferably takes a set of readings with the system in pristine condition and saves the values of those measurements for later comparisons or analyses. The signal processing and control unit may then take measurements as needed, either continuously, in conjunction with each high-voltage pulse, or on an intermittent basis. It may further accumulate statistics on those readings, looking either for significant deviations in one reading from the previous, or for longer-term trends in readings.

Figure 7:
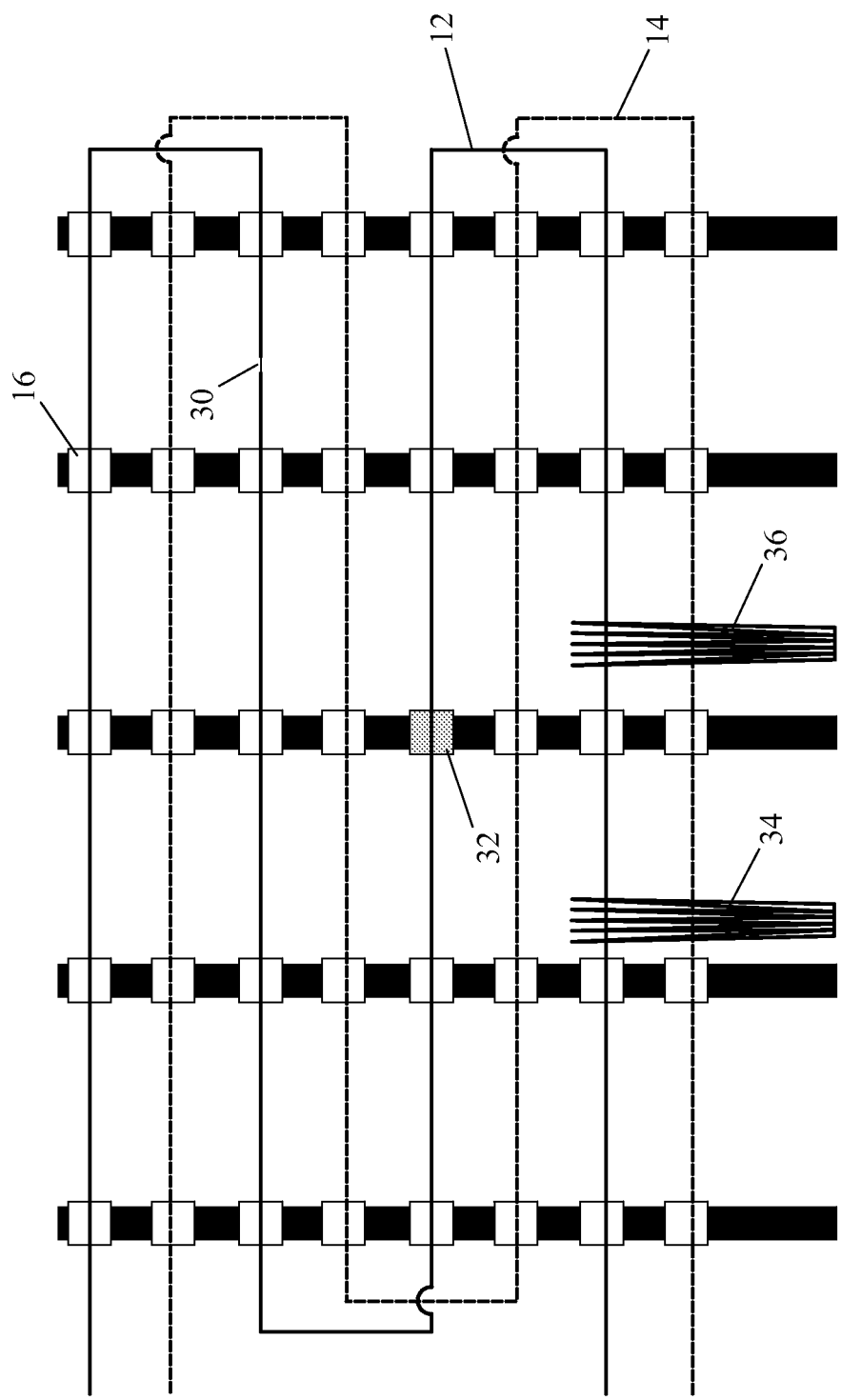
FIG. 7 shows a fence section with some possible causes of operational disturbance.

FIG. 7 shows a fence section with some possible causes of operational disturbance. Short-term analysis may be used to provide an indication of an attempted intrusion or of occasional contact with vegetation. Short-term readings may also provide an indication of a break in the wire (30). Comparing readings from one day to the next provides an indication of daily variations due to environmental factors, including, but not limited to, temperature, humidity, and dew. Long-term trends may indicate the growth of vegetation (34), (36) or of the degradation of an insulating stand-off (32).

In one preferred embodiment, the signal processing and control unit (26) sends measurements to the service center via the communications interface (28) on a frequent basis, allowing the use of complex software and information obtained from other sources, such as weather bureaus, or involving human judgment in the process of analysis. This allows for a more complex and subtle analysis, but at the expense of frequent or possibly large data transfers. In another preferred embodiment, the signal processing and control unit (26) performs more complex analyses internally and contacts the service center with regular updates when the analyses indicate normal operation with expected slow degradation, and promptly, when the analyses indicate possible intrusion, a need for immediate service, or system failure. In either embodiment, the signal processing and control unit (26) may set the adjustable signal generator to produce more or less powerful high-voltage pulses in order to maintain appropriate signal levels on the fence wire (12).

Figure 8:
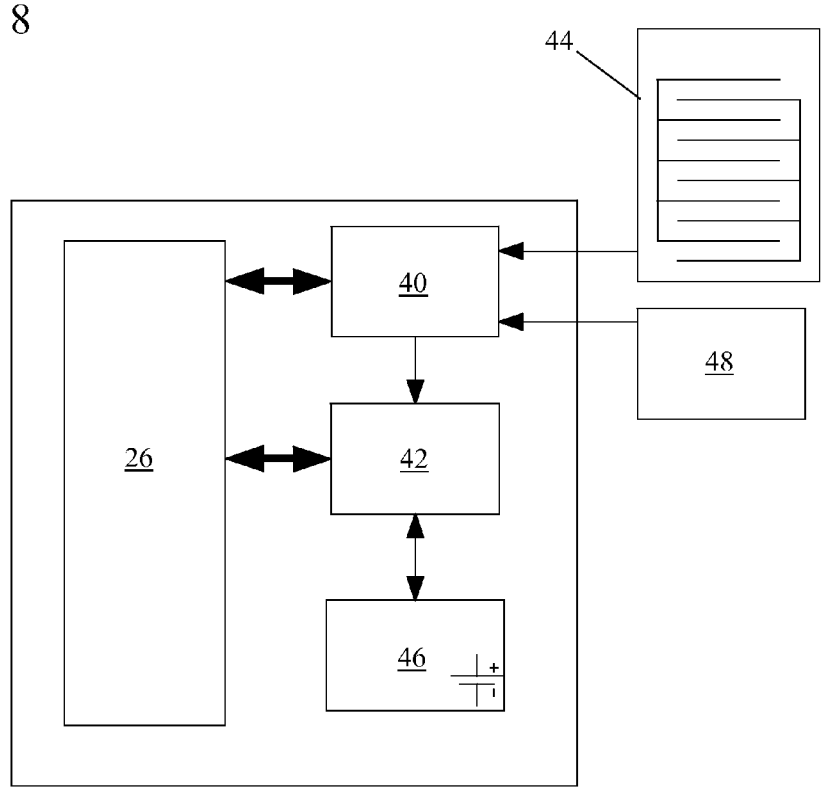
FIG. 8 shows additional internal features of the electric fence control unit, and connection to sources of operational power.

FIG. 8 shows another feature of a preferred embodiment of the electric fence control unit, namely connection of a solar panel (44), an external mains power (48), a power conversion unit (40), a battery charge control and monitor circuit (42), and a battery (46). Different embodiments may include only one, some, or all of these sources of operating power, or other sources such as wind generators. A highly preferred embodiment includes the battery (46) and at least one additional source of operating power, such as the solar panel (44). The battery charge control and monitor circuit connects the source or sources of power to the battery, and operates in such a manner as to charge the battery as needed from the external power source and to report the state of charge of the battery to the signal processing and control unit (26). The signal processing and control unit preferably provides this information to the service center in its regular update messages and may also initiate communication with the service center, should any urgent need arise. In some embodiments, in a unit that receives power from the external mains power (48), the signal processing and control unit (26) initiates communication to inform the service center of the loss of the mains power.

The features just described also allow for further capabilities. The signal processing and control unit (26) may monitor the state of charge of the battery (46), and in the event that it determines that insufficient power exists to continue operating with nominal parameters, it adjusts the voltage level or frequency of high-voltage charges produced by the adjustable signal generator. It may follow a programmed course of action, where it initially reduces the frequency of impulses from nominal, for example from once per second to once every 1.5 seconds, and if the low power situation persists or worsens, to reduce the voltage of some or all of the high-voltage pulses.

A microprocessor-controlled energizer preferably includes one or more, most, or all of the following features.

Matching capacity and load significantly increases efficiency. In a preferred embodiment, each of the three capacitors in the energizer may be set to any power level between 2 J and 5 J. This allows for the output level to be customized to the conditions of the specific fence being supplied by the energizer. The power level may be set during installation and adjusted either on-site or remotely.

Uses of time-domain reflectometry (TDR) by the microprocessor provides an estimate of the location of shorts in the system. In between the pulses a unique signal may be sent to check for shorts. By measuring the time required to receive a reflected signal, the microprocessor estimates the distance to a short.

Key performance data is stored locally in the microprocessor, automatically downloaded to a central location, and able to be queried both locally and remotely. Key performance data includes, but is not limited to, output and return voltage stored and compared to generate up to four alarm modes, where the duration and the minimum voltage level of each alarm level may be continuously adjusted, any deviation between output and return voltage greater than 1000 V that is recorded, and output from the solar cell and capacity of the battery.

In addition to storing the key performance data locally, there is preferably automated wireless, machine-to-machine communication, allowing storage of the data in a central location. Performance data may also be accessed via a wireless remote query or a local query. Analysis of this data at a central location provides the following benefits:

Enhanced security at the local site by increasing the period of time between pulses allows the husbanding of battery capacity and utilizing data analytics for predictive maintenance in place of emergency maintenance or failure.

Matching capacity and load leads to development of a more efficient system, which allows for a reduction of cost by properly scaling solar panels and batteries.

Having the ability to do remote queries of key performance data reduces the need to involve the customer in troubleshooting, leading to greater customer satisfaction.

Having the ability to do local queries of key performance data allows the technician to troubleshoot more efficiently, resulting in faster resolution of tickets and yielding greater uptime for the customer (enhanced security) and lower cost to the company.

Fault location estimation is preferably based on an adaptation of time-domain reflectometry. The microprocessor rapidly samples the voltage of the outgoing and returning pulses. This allows the processor to perform various analyses on these sampled wave forms to look for faults, intrusions, or other aspects or irregularities of interest.

In some embodiments, the fence energizer is coordinated with other units to provide synchronized firing of energizers among coupled fences. This feature, while not necessary for analytic purposes, greatly increases the usefulness of the fence energizer in areas where multiple electric fences must be placed in close proximity. In some embodiments, an inductive coupling ring, such as, for example, those found in clamp-on current-measuring probes, detects the outgoing pulse from an energizer deemed to be the master. The adjacent units are set into a slave mode, where they trigger off of the signal sent by the coupling ring. A benefit of this arrangement is its simplicity, where a ring is simply clipped around the wire of the master fence and the mode of the others is sent.

Figure 9:
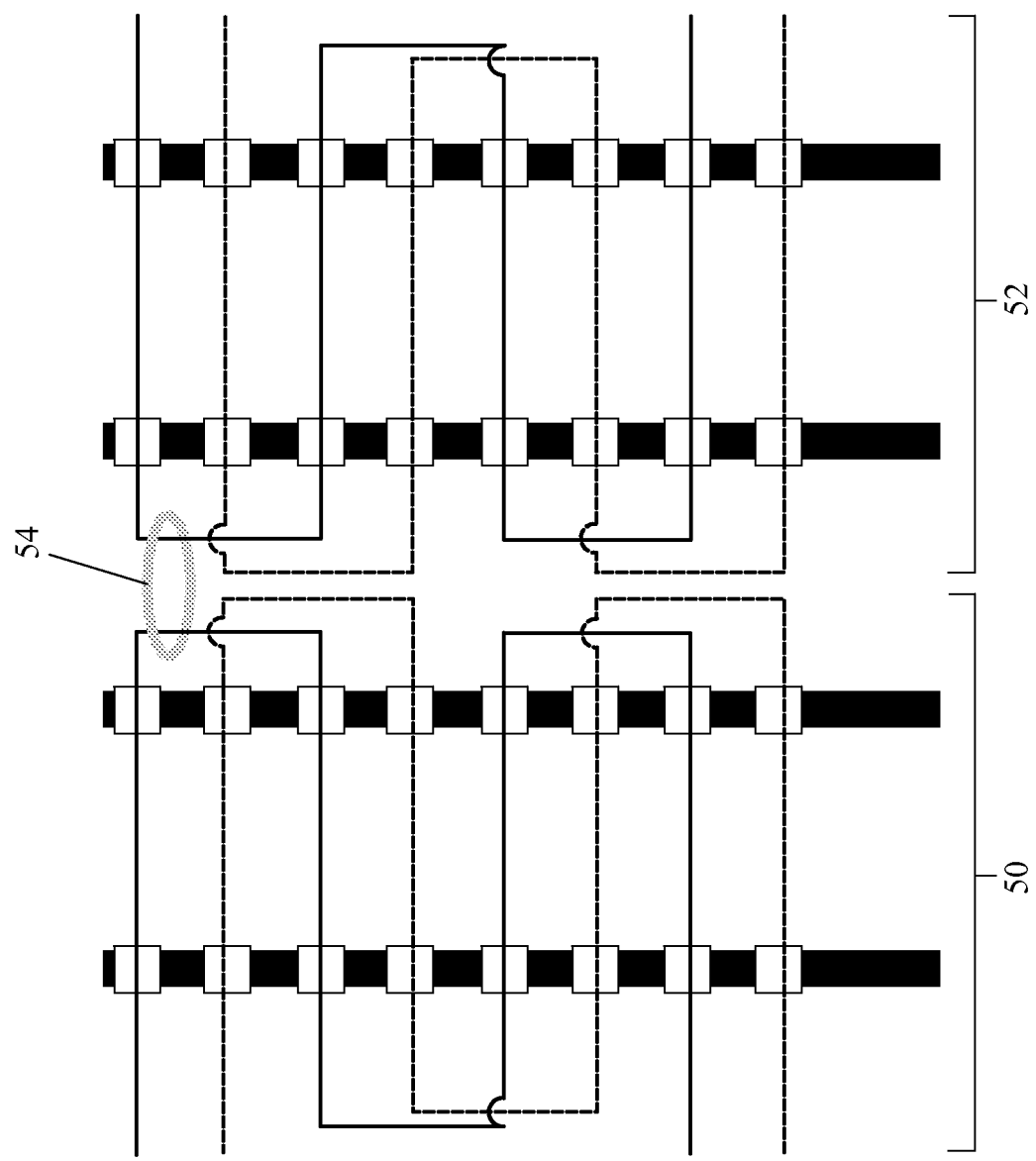
FIG. 9 shows two electric fence sections coupled together for synchronization.

In FIG. 9, an inductive coupler (54) between hot wires of two fence sections (50) (52) facilitates synchronization of signals.

Figure 10:
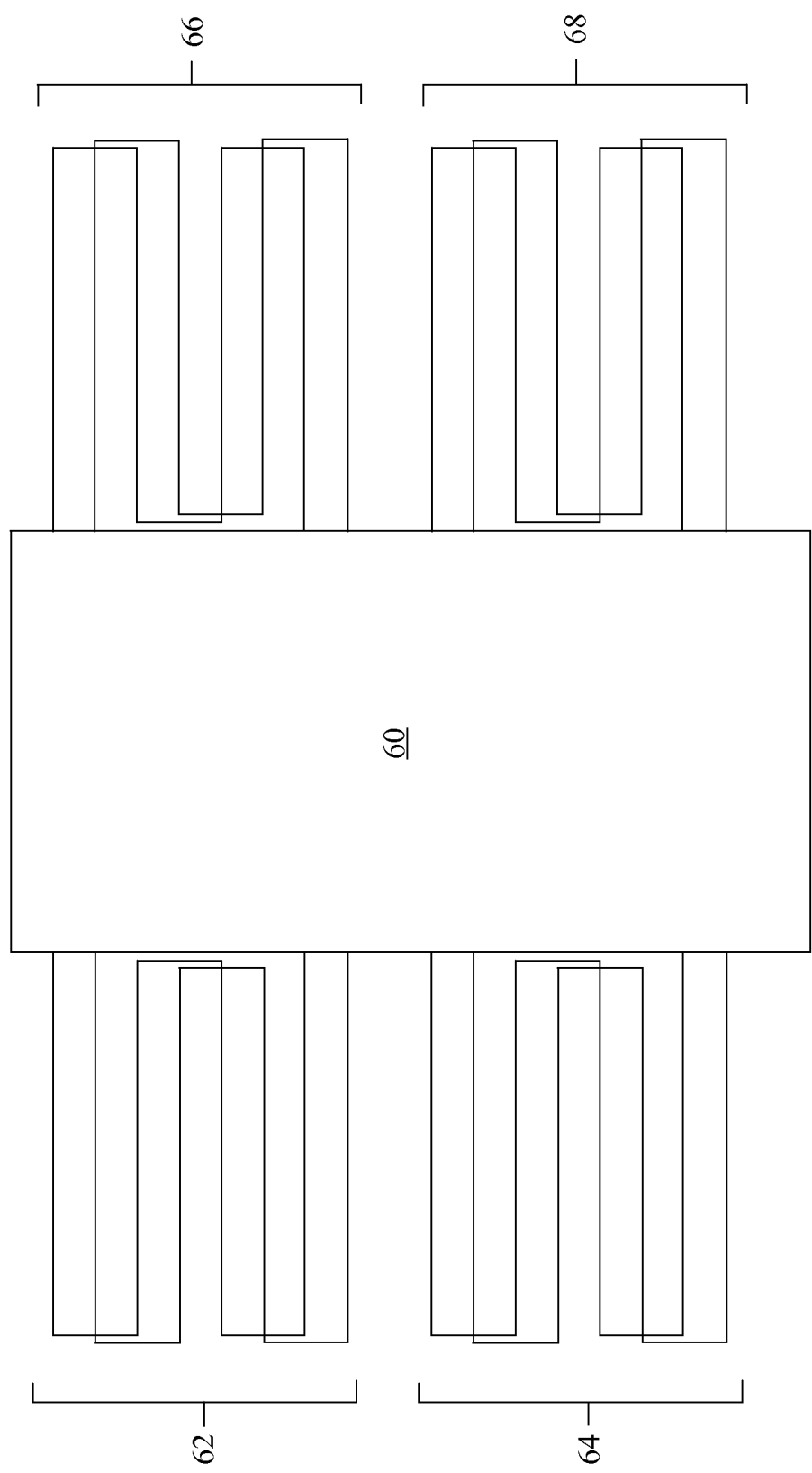
FIG. 10 shows a fence control unit controlling multiple fence sections.

In FIG. 10, an electric fence control unit (60) with signal generators and receivers for control of multiple fence sections is operatively connected to control four fence sections (62), (64), (66), (68).

Systems and methods of the present invention are preferably used with an electric fence energizer of an electric fence system. Example locations for an electric fence energizer that would benefit from systems and methods of the present invention include, but are not limited to, equipment storage lots, perimeter fences around high-security buildings, inventory warehouses, and any locations that need a protective fence.

Preferred advantages provided by systems and methods of the present invention include, but are not limited to, the following:

a greatly expedited diagnostic process in finding fault locations of a fence, the ability to see trends in energizer performance that indicate action is needed before a catastrophic failure happens, which increases the ability of an operator to schedule maintenance rather than responding to a fence failure, remote reporting of data capabilities to correlate weather patterns, water dew patterns, and other public data to determine the state of vegetation touching the fence wire, information that may be used to determine when landscape maintenance or other work must be performed to keep the fence in top shape, estimating the condition of the fence to indicate tampering, fence joints that have become loose, or other problems with the fence wire by measuring the outgoing and returning voltages of the fence pulse, the ability to implement new analytic methods that are used to determine the performance or the condition of various pieces of the fence system, reducing the amount of time a person must be on-site working on an electric fence to diagnose or fix any problems in the operation of the electric fence, providing an appropriate power output level for any given fence, thereby increasing safety and reducing power waste, and permitting easy coupling of two or more electric fences to synchronize the energizers to pulse at the same time or nearly the same time.

Systems and methods of the present invention may be used in new electric fence energizer systems or to enhance existing electric fence energizer performance, where they may be incorporated directly into existing products or provided by way of an add-on assembly.

In some embodiments, TDR is used to determine reflections of the electric pulse sent on the fence. In some embodiments, the microprocessor provides the TDR function. A time-domain reflectometer is an electronic instrument conventionally used to characterize and locate faults in metallic cables, such as, for example, twisted wire pairs and coaxial cables. In some embodiments, the time-domain reflectometer transmits a short rise time pulse along a conduction route of the electric fence. Any impedance discontinuities in the route cause some of the incident signal to be sent back, or reflected, towards the source. In some cases, the reflected signal is of a similar magnitude as the background noise and the microprocessor sorts the reflected signal from the noise. Increases in the impedance create a reflection that reinforces the original pulse, but decreases in the impedance create a reflection that opposes the original pulse. Return signals for given impulses are preferably compared to baseline return signals previously measured for a particular electric fence. A change in the measured return signal indicates a change in the electrical properties of the electric fence, which may be indicative of a problem with the electric fence. In the present application of TDR, both the reflected and the originally transmitted signals are preferably sampled and quantified.

In some embodiments, the electric fence energizer uses quantitative methods to compare signals and to determine from the reflection pattern the location of faults in the electric fence. In some embodiments, the microprocessor measures the time delay for the reflection to return to the source and the speed of the pulse to calculate the distance of the fault from the energizer.

In some embodiments, the electric fence energizer maps a given fence by learning the standard reflection pattern of the fence to be used as a comparison standard to identify anomalous future events, intrusions, and faults.

In some embodiments, the electric fence energizer incorporates a variable power level output to augment TDR function.

In some embodiments, the electric fence energizer provides variable power level output via a software-settable value for use with different sized fences.

In some embodiments, the electric fence energizer provides variable power level output settable via cell-phone link for use with different sized fences.

In some embodiments, the electric fence energizer incorporates analytic methods to provide real-time diagnostic information about the condition of the electric fence, including, but not limited to, if vegetation has grown up onto the fence, if a person has tampered with the fence, or other anomalous conditions.

In some embodiments, the electric fence energizer uses the electrical properties of the output pulses to determine the overall length of a fence. If the electrical properties of the output pulses change over time, as would occur if the fence length changed, this indicates tampering with the fence or other problems.

In some embodiments, the electric fence energizer incorporates analytic methods to provide real-time diagnostic information about the condition of the energizer unit or its power supply.

In some embodiments, the electric fence energizer incorporates multiple gradations in the alarm criteria, including, but not limited to, an indication of how close the fence or energizer unit is to catastrophic failure.

In some embodiments, the electric fence energizer is capable of receiving new software to implement new analytic methods as desired to determine performance or condition of various pieces of the fence system.

In some embodiments, the electric fence energizer receives sensor input from an inductively-coupled (sometimes called a transformer-coupled) sensor.

In some embodiments, the electric fence energizer coordinates its pulse firing with the input from another energizer generated by this inductive coupling.

In some embodiments, the electric fence energizer coordinates its pulse firing with input from another energizer generated by direct measurement of an electrical pulse.

The TDR capabilities in an electric fence energizer are preferably used to estimate a fault location. The electric fence energizer preferably provides continuously variable power output settings via a software-settable value. The electric fence energizer preferably provides analytic information that may be used to determine the condition of the fence, the energizer unit, or its power supply.

Methods of the present invention are preferably microprocessor-implemented. The methods presented herein are not inherently related to any particular microprocessor or other apparatus. Various general purpose systems may also be used with programs in accordance with the teachings herein, or it may prove convenient to construct more specialized apparatus to perform the required method steps. In addition, the present invention is not described with reference to any particular programming language. It is appreciated that a variety of programming languages may be used to implement the teachings of the present invention as described herein, and any references to specific languages are provided for disclosure of enablement and best mode of the present invention.

Embodiments of the present invention are well suited to a wide variety of microprocessors network systems over numerous topologies. Within this field, the configuration and management of large networks include storage devices and microprocessors that are communicatively coupled to dissimilar microprocessors and storage devices over a network, such as the internet. A microprocessor, as used herein, may be any automated processor that operates based on following instruction codes. In some embodiments, a microprocessors refers to a network of two or more processors working together to follow such instruction codes.

Accordingly, it is to be understood that the embodiments of the invention herein described are merely illustrative of the application of the principles of the invention.

Reference herein to details of the illustrated embodiments is not intended to limit the scope of the claims, which themselves recite those features regarded as essential to the invention.

What is claimed is:

1. A method of diagnosing and controlling an electric fence system comprising the steps of:
   a) transmitting a first adjustable power signal along a conduction route of a first electric fence of the electric fence system;
   b) sampling a first signal output of the first adjustable power signal at a driven end of the conduction route;
   c) sampling a second signal output of the first adjustable power signal at an open end of the conduction route;
   d) analyzing the first signal output and the second signal output to determine a load on the electric fence system;
   e) setting the first adjustable power signal to a first power level to match capacity to the load; and
   f) repeating the method from step (a).

2. The method of claim 1, wherein the step of setting the first adjustable power signal to a first power level to match capacity to the first load comprises varying at least one intermediate voltage of at least one pulse capacitor of the electric fence system.

3. The method of claim 1, further comprising the steps of:
   storing data in a microprocessor comprising the first signal output and the second signal output;
   analyzing the first signal output and the second signal output; and
   storing data comprising results of the analyzing step in the microprocessor.

4. The method of claim 3, further comprising querying the data in the microprocessor to determine what maintenance of the electric fence system is required.

5. The method of claim 4, further comprising predicting required maintenance of the electric fence based on the stored data comprising results of analyzing the first signal output and the second signal output.

6. The method of claim 1, wherein step e) is based on an input from a location remote from the electric fence.

7. An electric fence control unit comprising:
   a signal generator generating and transmitting an adjustable power signal along a conduction path of a fence line of an electric fence;
   a first signal receiver sampling a first signal output at a driven end of the fence line at a plurality of first predetermined time intervals;
   a second signal receiver sampling a second signal output at an open end of the fence line;
   a signal processing and control unit receiving the first signal output and the second signal output and analyzing the first signal output and the second signal output; and
   a communications interface for transmitting results from analyzing the first signal output and the second signal output to a service center;
   wherein the adjustable power signal is adjustable to any capacity power level between a maximum power level and a minimum power level to match a load of the electric fence.

8. The electric fence control unit of claim 7, wherein the signal generator comprises at least one pulse capacitor storing and releasing a charge which is variable between a maximum voltage and a minimum voltage to adjust the adjustable power signal.

9. An The electric fence control unit of claim 7, further comprising
   an electric fence.

10. The electric fence control unit of claim 1, further comprising at least one input power supplying power to the electric fence control unit, the input power selected from the group consisting of:
   a mains power source;
   a battery;
   a solar power source; and
   a wind generator.

11. The method of claim 1, further comprising the steps, before step (f), of:
   monitoring a state of charge of a power source; and
   if the monitoring of the state of charge shows that insufficient charge exists, adjusting a power of the first power signal.

12. The method of claim 11, in which the step of adjusting is performed by adjusting a voltage level of the first power signal.

13. The method of claim 11, in which the step of adjusting is performed by adjusting a frequency of the first power signal.

14. The method of claim 11, further comprising the step of storing data in the microprocessor comprising the state of charge of the power source.

15. The method of claim 14, further comprising querying the data in the microprocessor comprising the state of charge of the power source to determine what maintenance of the electric fence system is required.

16. The method of claim 14, further comprising predicting required maintenance of the electric fence based on the stored data comprising the state of charge of the power source.

17. The method of claim 14, further comprising the step of communicating the stored data to a remote location.

18. The method of claim 3, further comprising the step of communicating the stored data to a remote location.

19. The electric fence control unit of claim 7, in which the signal processing and control unit comprises a microprocessor having program memory for storing instructions and random access memory for storing data.

20. The electric fence control unit of claim 19, in which the program memory stores instructions causing the microprocessor to analyze the first signal output and the second signal output and to store data comprising the first signal output and the second signal output and results from the analysis in the random access memory.

21. The electric fence control unit of claim 19, in which the program memory stores instructions causing the microprocessor to analyze a state of charge of a power source and to store data comprising the state of charge and results from the analysis in the random access memory.

22. A method of diagnosing an electric fence system comprising the steps of:
   a) transmitting a first adjustable power signal along a conduction route of a first electric fence of the electric fence system;
   b) sampling a first signal output of the first adjustable power signal at a driven end of the conduction route;
   c) sampling a second signal output of the first adjustable power signal at an open end of the conduction route;
   d) analyzing the first signal output and the second signal output to determine a first load on the electric fence system;
   e) storing data in a microprocessor comprising the first signal output, the second signal output and results of the analyzing step (d) in the microprocessor; and
   f) repeating the method from step (a).

23. The method of claim 22, further comprising querying the data in the microprocessor to determine what maintenance of the electric fence system is required.

24. The method of claim 23, further comprising predicting required maintenance of the electric fence based on the stored data comprising results of analyzing the first signal output and the second signal output.

25. The method of claim 22, further comprising the step of communicating the stored data to a remote location.

* * * * *

UNITED STATES PATENT AND TRADEMARK OFFICE
CERTIFICATE OF CORRECTION

PATENT NO. : 9,839,104 B2  
APPLICATION NO. : 14/775216  
DATED : December 5, 2017  
INVENTOR(S) : Jack DeMao Page 1 of 1

It is certified that error appears in the above-identified patent and that said Letters Patent is hereby corrected as shown below:

In the Claims

Claim 9 (Column 10, Line 65): "An The electric fence" should read "The electric fence"

Signed and Sealed this  
Fifth Day of June, 2018

Andrei Iancu  
*Director of the United States Patent and Trademark Office*